(12) United States Patent
Srivastava et al.

(10) Patent No.: US 11,579,776 B2
(45) Date of Patent: Feb. 14, 2023

(54) OPTIMIZING POWER CONSUMPTION OF MEMORY REPAIR OF A DEVICE

(71) Applicant: Silicon Laboratories Inc., Austin, TX (US)

(72) Inventors: Mudit Srivastava, Singapore (SG); Anil Shirwaikar, San Antonio, TX (US); Yu Zhou, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 68 days.

(21) Appl. No.: 17/078,224

(22) Filed: Oct. 23, 2020

(65) Prior Publication Data

US 2022/0129166 A1  Apr. 28, 2022

(51) Int. Cl.
| | |
|---|---|
| *G06F 3/06* | (2006.01) |
| *G11C 29/00* | (2006.01) |
| *G11C 29/04* | (2006.01) |

(52) U.S. Cl.
CPC .......... *G06F 3/0614* (2013.01); *G06F 3/0625* (2013.01); *G06F 3/0629* (2013.01); *G06F 3/0679* (2013.01); *G11C 29/70* (2013.01); *G11C 2029/0407* (2013.01)

(58) Field of Classification Search
None
See application file for complete search history.

(56) References Cited

U.S. PATENT DOCUMENTS

| | | | |
|---|---|---|---|
| 7,539,538 B2 | 5/2009 | Parramon et al. | |
| 9,653,181 B1* | 5/2017 | Shim | G11C 29/08 |
| 2001/0021134 A1* | 9/2001 | Bohm | G11C 29/24 |
| | | | 365/202 |
| 2007/0081377 A1* | 4/2007 | Zheng | G11C 7/20 |
| | | | 365/96 |
| 2015/0098287 A1* | 4/2015 | Lee | G11C 29/785 |
| | | | 365/200 |
| 2018/0102185 A1* | 4/2018 | Yang | G11C 17/16 |
| 2019/0325976 A1* | 10/2019 | Ko | G11C 7/08 |

FOREIGN PATENT DOCUMENTS

WO    WO-0141150 A2 *  6/2001  .......... G11C 29/802

OTHER PUBLICATIONS

Silicon Labs, "EFR32FG14 Flex Gecko Proprietary Protocol SoC Family Data Sheet," Rev. 1.2, Feb. 23, 2017, 163 pages.
U.S. Appl. No. 16/417,700, filed May 21, 2019, entitled, "Performing Low Power Refresh of a Digital-To-Analog Converter Circuit," by Mudit Srivastava, et al.

* cited by examiner

*Primary Examiner* — Guerrier Merant
(74) *Attorney, Agent, or Firm* — Trop, Pruner & Hu, P.C.

(57) ABSTRACT

In one aspect, an apparatus includes a memory repair controller coupled to a memory. The memory repair controller may be configured to provide repair information to cause the memory to disable one or more faulty locations in the memory, and the memory repair controller can be disabled after providing the repair information.

17 Claims, 5 Drawing Sheets

OPTIMIZING POWER CONSUMPTION OF MEMORY REPAIR OF A DEVICE

BACKGROUND

In semiconductor devices having on-chip memory, there are often defects that arise in manufacturing. To provide protection, redundant memory locations are formed, and can be used in place of faulty locations. To realize this protection, a device typically includes a memory repair controller that initiates a power-on repair upon bootup. This controller is provided with power to maintain the state of the memory repair operation throughout the complete operation of the chip. Often this leads to an increase in both static and dynamic power consumption since a clock to the controller is available from bootup, and the controller is always powered on. For low power battery-operated memory intensive devices that are often in sleep mode and are active mostly on demand, this situation can lead to reduction in battery life of the chip. Also, by always keeping the clock to the repair controller running, an illegal/re-triggering of a state transition may occur, leading to an undesired re-bootup.

SUMMARY OF THE INVENTION

In one aspect, an apparatus includes: a memory; and a memory repair controller coupled to the memory. The memory repair controller may be configured to provide repair information to cause the memory to disable one or more faulty locations in the memory, and the memory repair controller can be disabled after providing the repair information.

In an example, the apparatus further comprises a boot oscillator to output a boot clock signal. The apparatus may further include a control circuit to provide the boot clock signal to the memory repair controller after a reset and to gate the boot clock signal from being provided to the memory repair controller after the memory repair controller provides the repair information.

In an example, the apparatus further includes a reset management circuit coupled to the memory repair controller. The memory repair controller, after providing the repair information, may send an acknowledgment signal to the reset management circuit to cause the reset management circuit to gate the boot clock signal. The apparatus may further include: a switchable power domain comprising the memory repair controller and the memory; and another power domain comprising the reset management circuit, the another power domain comprising an always powered on domain. In a sleep state, the switchable power domain is to be powered down, and the plurality of repair registers are to retain the repair information while in the sleep state. In response to the acknowledgment signal from the memory repair controller, the reset management circuit is to provide a system reset signal to a main processor.

In an example, the reset management circuit is to prevent another acknowledgment signal from the memory repair controller subsequent to the acknowledgment signal from causing another system reset signal to the main processor. The apparatus may further include a plurality of repair registers each associated with a portion of the memory, the memory repair controller is to provide the repair information comprising faulty row/column information to the plurality of repair registers via a daisy chain.

In another aspect, a method comprises: in response to a boot clock signal received in a memory repair controller after a power-on reset event, accessing by the memory repair controller, encoded repair information in a non-volatile storage; decoding, in the memory repair controller, the encoded repair information and providing decoded repair information to one or more memory circuits; and thereafter sending a repair acknowledgment signal to a reset management circuit to cause the reset management circuit to de-assert a system reset signal to a main processor and cause the memory repair controller to be powered down.

In an example, the method further comprises in response to the repair acknowledgment signal, gating the memory repair controller. The method may further comprise de-asserting the system reset signal after the reset management circuit receives the repair acknowledgement signal. The method may further comprise maintaining the memory repair controller powered down until a next power-on reset event, the memory repair controller in a switchable power domain with one or more memory circuits. The method may further include preventing a glitch from the memory repair controller from causing another system reset signal to be sent to the main processor. The method may further include enabling a boot oscillator in response to the power-on reset event, the boot oscillator to provide the boot clock signal to the memory repair controller. The method further may include sending the repair acknowledgment signal in response to verifying that the memory repair was completed successfully.

In yet another aspect, a device includes: a reset management circuit to receive a system reset signal on a power-on reset of the device and delay provision of the system reset signal to a main processor; a boot oscillator to generate a boot clock signal in response to the power-on reset; a memory repair controller coupled to the reset management circuit, the memory repair controller to operate using the boot clock signal, wherein the memory repair controller is to provide repair information to a plurality of repair registers associated with memory circuitry, wherein in response to the repair information, the memory circuitry is to disable one or more faulty locations. The reset management circuit may prevent the boot clock signal from being provided to the memory repair controller after the repair information is provided to the plurality of registers.

In an example, the memory repair controller is to send a repair acknowledgement signal to the reset management circuit to cause the reset management circuit to gate the boot clock signal to prevent the boot clock signal from being provided to the memory repair controller. The device may further include: a switchable power domain comprising the memory repair controller and the main processor; and another power domain comprising the reset management circuit, the another power domain comprising an always powered on domain.

DETAILED DESCRIPTION

In various embodiments, an integrated circuit (IC) having on-chip memory may have a memory repair controller that is implemented in a switchable power domain. In this switchable power domain, power can be removed and/or reduced to a lower level, e.g., a retention level during operation when the domain (and the included memory repair controller) is inactive. Although in this switchable power domain, understand that circuitry may be present to maintain repair state information, even in a low power mode since a sufficient retention power level is provided to such circuitry. Still further with embodiments, a power-on-repair process is performed only once on bootup and is not repeated until there is a new chip reset event. As such, embodiments provide a power-optimized memory repair solution that is both fail-safe and very low-power consumption (realizing both dynamic and static power savings).

Figure 1:
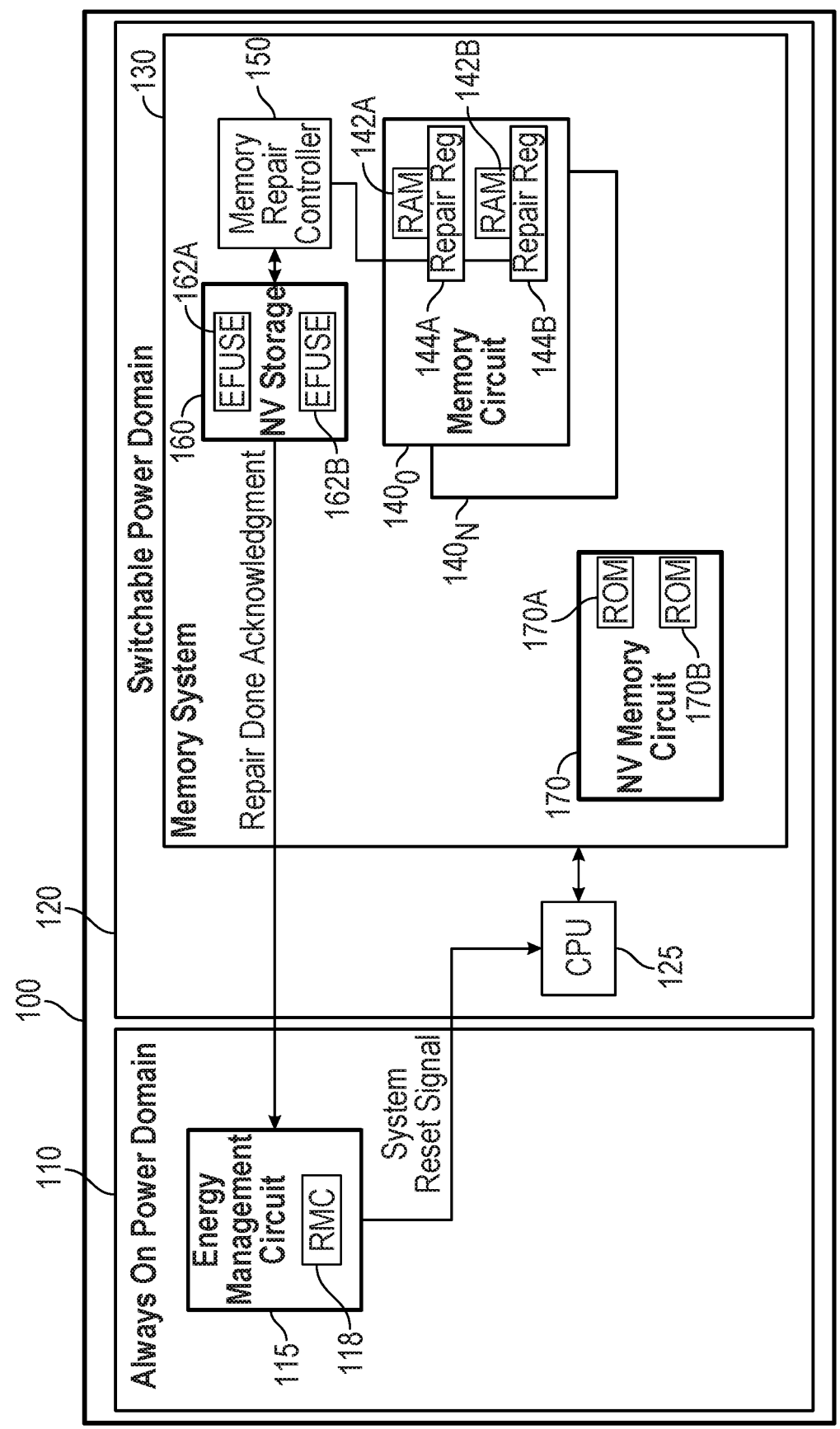
FIG. 1 is a block diagram of a device in accordance with an embodiment.

Referring now to FIG. 1, shown is a block diagram of a device such as an IC, e.g., including a single semiconductor die, in accordance with an embodiment. As shown in FIG. 1, IC 100 may be any type of circuit such as a controller, sensor, actuator or other type of IoT device. Device 100 may include multiple power domains, including a first power domain 110 and a second power domain 120. Of course, while shown with only two power domains for ease of illustration, understand that additional power domains may be present in other cases.

In the embodiment of FIG. 1, first power domain 110 is an always on power domain that is continually provided with power. In contrast, second power domain 120 is a switchable power domain that is provided with an active power level only when in operation. Understand however that second power domain 120 (or at least portions thereof) may be provided with a retention power level even when inactive. By providing these separate power domains, relatively low power consumption may be realized such that device 100 can be battery-powered and maintain longevity, such as over the course of a number of years.

FIG. 1 further shows details of the arrangement herein in which a memory repair controller is maintained in the switchable power domain, thus realizing even further power savings and potentially avoiding anomalous situations such as a glitched reset.

Starting first with first power domain 110, included is an energy management circuit 115 which may control energy mode transitions within the chip as well as maintaining digital controls of power management devices within device 100. Relevant to the discussion herein, energy management circuit 115 includes a reset management circuit 118 which may perform various operations on reset of device 100 (which occurs when power is initially supplied to the device 100, e.g., when device 100 is provided with a battery or other power source).

In response to this reset of device 100, a system reset signal is provided to a central processing unit (CPU) 125, present in second power domain 120. However, reset management circuit 118 may delay sending this system reset signal as described further below. As further shown, energy management circuit 115 receives a repair acknowledgment signal from a memory repair controller 150. As will be described herein, memory repair controller 150 sends this repair acknowledgment signal upon completion of memory repair operations. To avoid CPU 125 or DMA from access to the memories that are not yet repaired, energy management circuit 115 is configured to hold the system reset signal from being sent to CPU 125 until after it receives the repair acknowledgment signal from memory repair controller 150.

Referring now to second power domain 120, a memory system 130 is present. In the embodiment shown, memory system 130 includes a plurality of volatile memory circuits $140_{0-N}$. In the embodiment shown, each memory circuit 140 may be implemented as one or more random access memories (RAMs). In one implementation each memory circuit 140 may be implemented with multiple memory banks, namely memory banks 142A-B. Understand while two banks per circuit are shown for representation, more or fewer banks may be present in other implementations. Furthermore, other configurations of memory may be present instead of banks. For example, memory circuits 140 may be implemented as a single bank with higher memory capacity or a memory having less capacity but dual port access. Further understand that one or more memory circuits 140 may be distributed for inclusion in different subsystems of device 100.

In addition, a non-volatile memory circuit 170 may be present, which may include read only memories (ROMs) 170A, 170B. Such ROMs 170 may be implemented in a distributed manner, and may store code for execution by different subsystems.

Memory circuits 140 may physically be implemented in a two-dimensional arrangement with a plurality of rows and a plurality of columns. As a result of manufacture caused by high density of bit cells, which occurs with very tight tolerances and at ever smaller technology nodes, manufacturing defects may exist. These defects may cause faults to be present in one or more rows and/or columns. As a result, typical memory circuits including memory circuits 140 are provided with redundancy by way of additional rows and columns during manufacture. Then based on manufacturing testing, faulty rows and/or columns can be identified.

Based on this manufacturing testing, repair information to identify faulty rows and/or columns is generated. In turn, this information may be permanently stored into device 100, e.g., burned in as so-called fuse information. More particularly as shown, a one-time programmable (OTP) or other non-volatile memory 160 is provided that includes this repair information in the form of fuses (eFuses) 162A,B, which may be written or burned in after this initial manufacturing testing as part of production. With this repair information stored in non-volatile memory, the contents may remain persistently, even when power is not provided (e.g., before a battery is installed).

Note that this repair information may take different forms in different implementations. In some cases, this repair information may be generated in an encoded manner. In one particular embodiment, the repair information may be encoded using run length encoding. Of course other encoding techniques such as other data compression techniques to reduce permanent data to be burned on an eFuse may be used in other implementations. Note that a given data compression technique may be performed with the basic assumption that not all memories are corrupted at the same time in a single die, so most of the "good" repairable memories having a similar/duplicate default repair signature, is a waste of resource to burn in eFuse. Hence, only for "faulty" repairable memory is a repair signature burned in, along with its location in the repair register chain and some other identification metrics to allow the repair controller to identify and retrieve the correct memory to repair upon boot-up.

During operation, and more specifically in response to a reset, memory repair controller 150 is powered on and is provided with a clock signal so that it is active to provide repair information stored in non-volatile memory 160 to memory circuits 140. In the case of encoded repair information, memory repair controller 150 decodes the repair information to identify faulty rows/columns. More specifically as shown, each memory circuit 140 includes a plurality of repair registers 144A,B, at least one of which associated with each corresponding memory bank 142 to receive and store the repair information for its corresponding memory bank. In this way, during operation faulty rows and/or columns within a given bank 142 are not used and instead redundant rows and/or columns are used in their place. To this end, each repair register 144 may provide its repair information to selection circuitry within corresponding memory bank 142, e.g. a multiplexer or so forth, that in turn selects redundant rows/columns and deselects faulty rows/columns. In an embodiment, repair registers 144 may be implemented as retention flops, thereby saving the repair state in a low power mode. Note that in addition to protected memory locations, there may be some amount of memory circuitry that is not protected with redundancy techniques as described herein.

As shown, memory repair controller 150 may provide the repair information to corresponding repair registers 144 in a daisy chained manner. In this way, the correct repair information is provided to the correct repair register 144 for a corresponding bank 142. Once memory repair controller 150 sends the repair information and verifies that the operation was completed successfully, it sends the repair acknowledgment signal to energy management circuit 115.

As will be described in more detail below, in response to receipt of this signal, energy management circuit 115, and more specifically reset management circuit 118, causes the clock signal provided to memory repair controller 150 to be gated, thus disabling memory repair controller 150 and saving its power consumption for the rest of a given reset cycle, which can last for days, weeks, months or even years.

Figure 2:
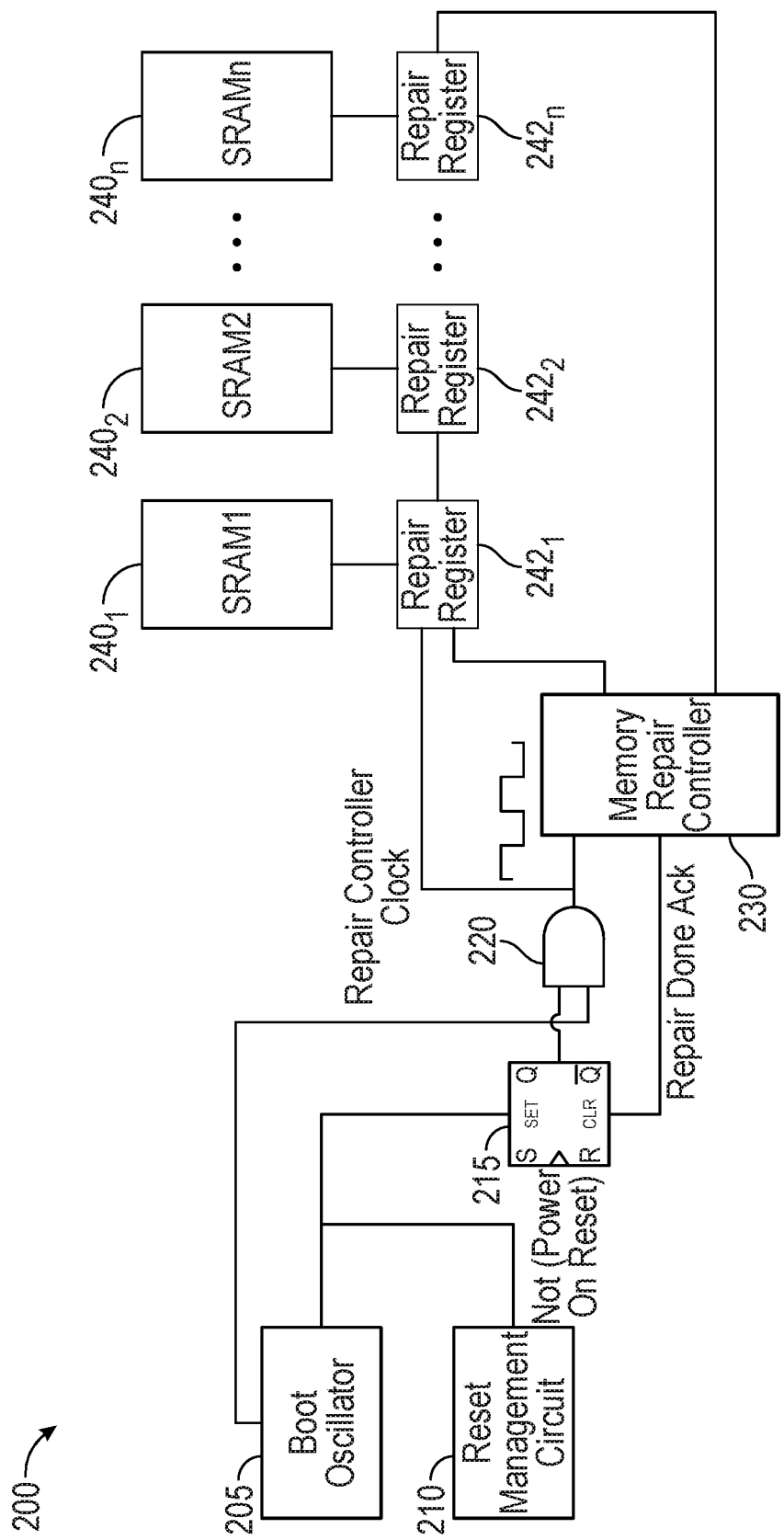
FIG. 2 is a block diagram of further details of a device in accordance with an embodiment.

Referring now to FIG. 2, shown is a block diagram of further details of a device in accordance with an embodiment. As shown in FIG. 2, device 200 may be the same IC as shown in FIG. 1, with different components highlighted. More specifically in FIG. 2, details regarding providing a clock signal to a memory repair controller 230 are illustrated.

As shown in FIG. 2, a boot oscillator 205 generates a clock signal after initial reset of device 200. More specifically, boot oscillator 205 is configured to generate this boot clock signal in response to a reset signal received from a reset management circuit 210. In an embodiment, this signal may be active on this initial reset, and acts to enable boot oscillator 205 and further provide a set signal to a latch circuit 215. In the embodiment shown, latch circuit 215 is implemented as an SR latch that provides a logic high output in response to this active set signal.

As shown, memory repair controller 230 provides repair information to a plurality of daisy chained repair registers $242_{1-n}$. Each repair register 242 is associated with a corresponding portion of a memory circuit, illustrated as RAM banks $240_1$-$240_n$. In an embodiment, these random access memories may be implemented as static random access memories (SRAMs). Of course other types of volatile memory devices such as dynamic random access memories and others may be used in other embodiments.

In FIG. 2 the output of latch circuit 215 is provided to a first input of an AND gate 220. In turn, the boot clock signal is provided to a second input of AND gate 220. As a result, during this initial reset phase latch circuit 215 outputs an active high signal, and the boot clock signal is provided to memory repair controller 230 as a repair controller clock. This repair controller clock enables memory repair controller 230 to provide the repair information from a non-volatile storage to repair registers $242_{1-n}$ each associated with a corresponding memory bank 240. Understand while shown with this implementation, there are other ways to implement this logic through an integrated clock gating cell or through latch circuitry.

When this operation is successfully completed, memory repair controller 230 sends a repair acknowledgment signal to latch circuit 215. More specifically, this acknowledgment signal is sent to a clear input of latch circuit 215, which causes AND gate 220 to gate the boot clock signal from being provided any further to memory repair controller 230 and to repair registers 242. As such at this point in time upon successful completion of providing the repair information to repair registers 242, memory repair controller 230 is gated from receiving a clock signal and thus remains inactive and power downed for a remainder of a reset cycle. With this arrangement, the boot oscillator clock from boot oscillator 205 is only requested once by memory repair controller 230 in response to a power-on reset event. After the repair signature is loaded into repair registers 242, this clock signal is gated all the way until a new power-on reset event is asserted. Understand while shown with this particular implementation in the embodiment of FIG. 2, many variations and alternatives are possible.

Figure 3:
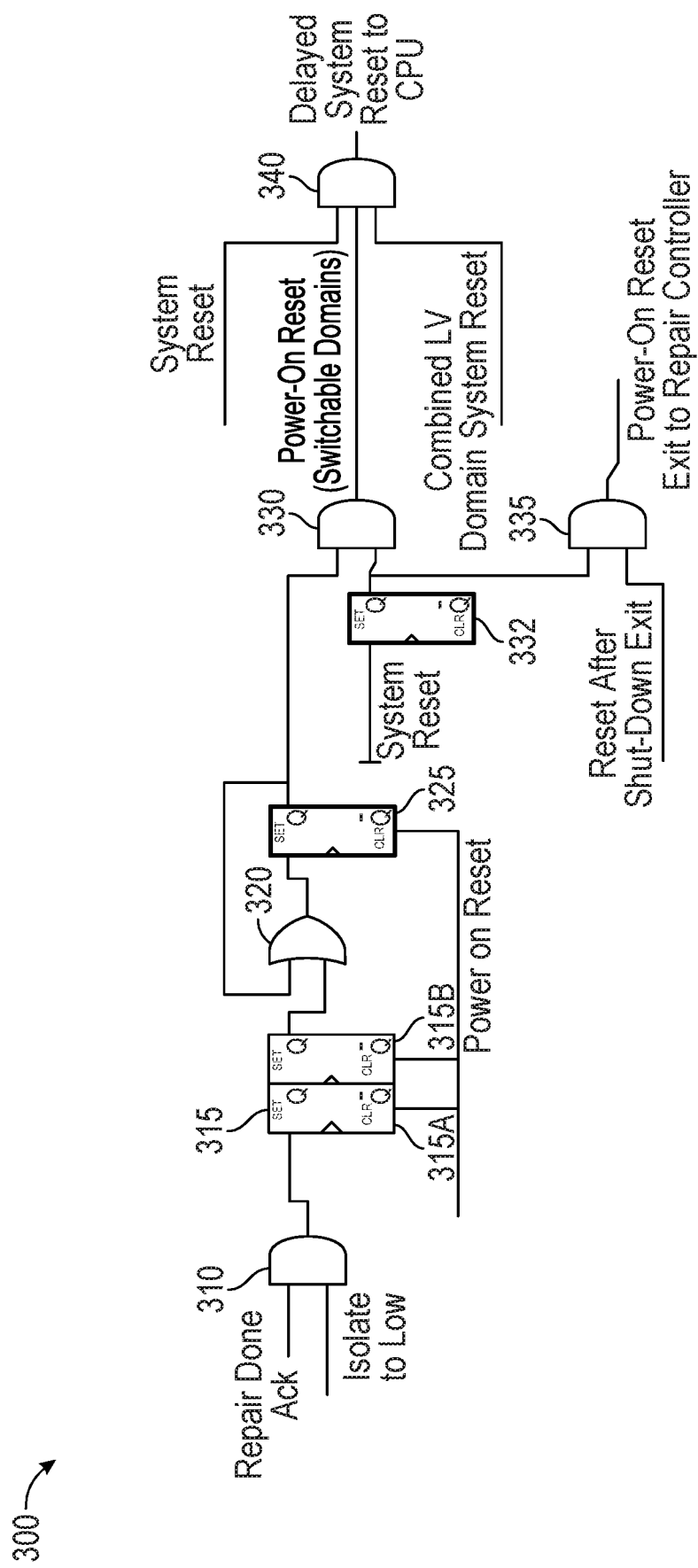
FIG. 3 is a schematic diagram of a portion of a reset management circuit in accordance with an embodiment.

Still further with embodiments herein, glitches emanating from a memory repair controller can be avoided. To this end, circuitry within a reset management circuit may operate to ignore or mask any glitches coming from a memory repair controller after it has already completed its configuration of repair information during an initial reset operation. Referring now to FIG. 3, shown is a schematic diagram of a portion of a reset management circuit in accordance with an embodiment. As shown in FIG. 3, a reset portion of reset management circuit 300 delays provision of a system reset signal to a main processing unit such as a CPU until after the memory repair is completed. Furthermore, the circuitry prevents glitches from occurring in response to spurious signals that may be received from the memory repair controller after the memory repair operation is completed. Such glitch may be due to intentional hacking the repair controller probe to glitch and restart the power-on repair. As such embodiments provide advanced security protection against external tamper or glitch As shown in FIG. 3, reset management circuit 300 includes logic circuitry to generate various signals used in a reset operation. Reset management circuit 300 includes an AND gate 310 that receives two inputs, namely a repair acknowledgment signal and an isolation signal. As described above, this repair acknowledgment signal may be sent from a memory repair controller when a memory repair operation performed on reset of a device is successfully completed. The isolation signal may be received from an energy management unit, which generates isolation control for each power domain interaction based on energy mode transitions and which power domain is optionally turned ON/OFF/RETAIN. AND gate 310 outputs an active high signal when both inputs are high, after successful completion of a memory repair operation.

As illustrated, this signal is sent to a deglitch circuit 315 (formed of a plurality of D-type flip-flops 315A, B), which are clocked by a power-on reset signal output based on the active high input. As seen, the output of deglitch circuit 315 is provided to a first input of an OR gate 320. A second input of OR gate 320 is received from an output of another flop 325, which acts as a feedback circuit and prevents a glitched signal from passing through, such that flop 325 is active only for single cycle. The output of flop 325 thus acts as a repair completion acknowledgment signal that is sent as an input to another AND gate 330 that further receives at another input an output of yet another flop 332, which receives a system reset signal. Note that the system reset signal is also provided to an AND gate 335, which further receives a reset signal after a shutdown exit. The output of AND gate 335 acts as a power-on reset signal that is provided to the memory repair controller to begin the memory repair.

Finally, note that the output of another AND gate 340 is a delayed system reset signal, which is sent to a CPU or other main processor. As such, AND gate 340 further receives as inputs a system reset signal and a low voltage domain system reset signal (from a low voltage domain in which a host and/or other processors, DMA and/or other peripherals reside). The delayed system reset signal does not become active until the memory repair is completed and has been successfully acknowledged. Stated another way, the reset signal is de-asserted after successful completion of the memory repair.

Thus as shown in FIG. 3, after power-on repair is completed, the acknowledgement from the memory repair controller is captured in reset management circuit 300 (more particularly in AND gate 310), which leads to releasing the system reset signal to rest of the logic where memories reside only once. As such, in case of any glitch/accidental clock propagation from a boot oscillator and the memory repair controller restarts unintended, it will not jeopardize system reset, and thus this solution is glitch protected. Stated another way, this delayed system reset signal ensures that there is no memory access happening (e.g., by a host CPU or a direct memory access (DMA) circuit) since it can cause incorrect memory access without a valid repair signature loaded. Understand while shown at this high level in the embodiment of FIG. 3 many variations and alternatives are possible.

Figure 4:
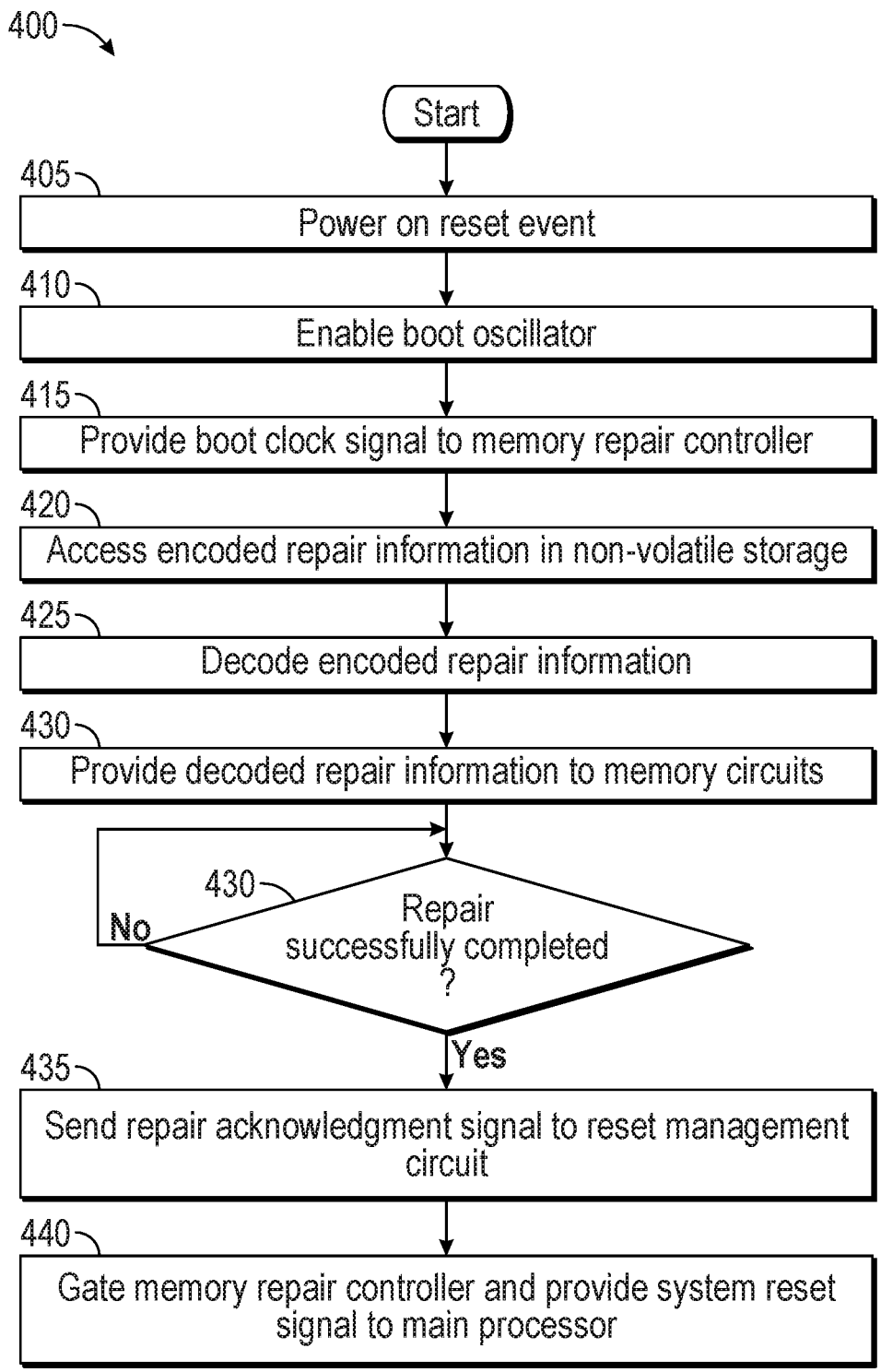
FIG. 4 is a flow diagram of a method in accordance with an embodiment.

Referring now to FIG. 4, shown is a flow diagram of a method in accordance with an embodiment. As shown in FIG. 4 method 400 is a method for performing a memory repair operation during a power on and controlling startup of a device as described herein. As such, method 400 may be performed by hardware circuitry, including a memory repair controller and a reset management circuit.

As illustrated, method 400 begins by way of a power-on reset event (block 405). This power-on reset event may be realized by application of power to a device. In this event, a boot oscillator may be enabled (block 410). In an embodiment, this oscillator may be implemented within an energy management circuit of a device. Next at block 415 a boot clock signal generated by this boot oscillator may be provided to a memory repair controller, which may be present in a switchable power domain.

Still with reference to FIG. 4, at block 420 the memory repair controller may begin memory repair operations by accessing encoded repair information stored in a non-volatile storage. In an embodiment, this non-volatile storage may be implemented as a fuse memory that stores encoded information about faulty rows/columns in one or more memory circuits. Understand while in the embodiment of FIG. 4 this information is encoded, in other cases the information may not be encoded. Next control passes to block 425 where the memory repair controller may decode the encoded repair information. At block 430 the decoded repair information may be provided to the memory circuits, and more specifically to one or more repair or other registers that store this information, which may be used to ensure that faulty locations are not used and redundant locations are instead used in their place.

Still with reference to FIG. 4, next it is determined at diamond 430 whether the repair has been successfully completed. If so, the memory repair controller may send a repair acknowledgment signal to the reset management circuit (block 435). In response to this signal, the reset management circuit may gate the memory repair controller, such as described herein and provide a system reset signal to a main processor such as a CPU (e.g., by de-asserting the signal) so that it may begin initialization (block 440). The rest of this reset and normal device operation may proceed with the memory repair controller powered down, thus reducing power consumption. Understand while shown at this high level in the embodiment of the FIG. 4, many variations and alternatives are possible.

Figure 5:
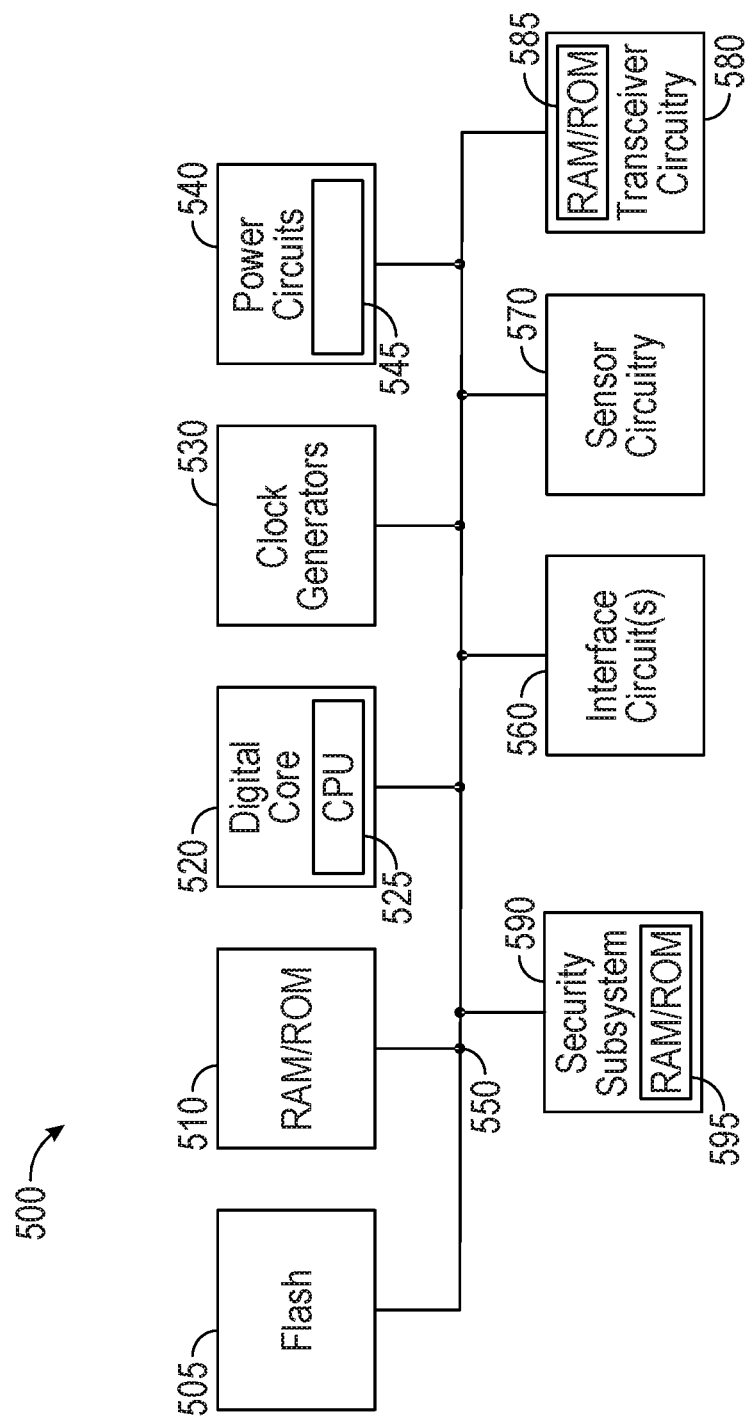
FIG. 5 is a block diagram of a representative device which may be incorporated into a wireless network as a node.

Embodiments may be implemented in many different types of end node devices. Referring now to FIG. 5, shown is a block diagram of a representative device 500 which may be incorporated into a wireless network as a node. In the embodiment shown in FIG. 5, device 500 may be a sensor, actuator, controller or other device that can be used in a variety of use cases in a wireless control network, including sensing, metering, monitoring, embedded applications, communications applications and so forth. As examples, device 500 may be a home automation and security device such as door locks, contact, motion, water and light sensors, battery powered thermostats, lighting and control devices, home appliances, consumer medical devices, gateways, or so forth.

In the embodiment shown, device 500 includes a memory system 510 which in an embodiment may include non-volatile and volatile storage (i.e., ROM and RAM). In addition, a flash memory 505 may be implemented as a non-transitory storage medium that can store instructions and data. In an embodiment, flash memory 505 (or ROM) may include code to execute method 400 of FIG. 4. While shown as separate blocks, it is possible for at least some ROM and RAM to be distributed also among other blocks and subsystems. At least the RAM may be protected using memory repair techniques as described herein.

Memory system 510 couples via a bus 550 to a digital core 520, which may include a CPU 525 or microcontroller that acts as a main processing unit of the device, and which may receive a delayed system reset signal as described herein. As shown, digital core 520 may couple to clock generators 530 which may provide one or more phase locked loops or other clock generation circuitry to generate various clocks for use by circuitry of the device (and which may include a boot oscillator as described herein).

As further illustrated, device 500 further includes power circuitry 540, which may include one or more voltage regulators. In an embodiment, power circuitry 540 may include an energy management circuit 545 and included reset management circuit as described herein, along with a bias generator and a brownout detector, among other circuitry.

Additional circuitry may optionally be present depending on particular implementation to provide various functionality and interaction with external devices. Such circuitry may include interface circuitry 560 which may provide interface with various off-chip devices, sensor circuitry 570 which may include various on-chip sensors including digital and analog sensors to sense desired signals, such as speech inputs, image inputs or so forth.

In addition as shown in FIG. 5, dynamic multi-protocol transceiver circuitry 580 may be provided (and which may include distributed RAM/ROM 585, with fault protection as described herein) to enable transmission and receipt of multi-protocol wireless signals, e.g., according to one or more local area wireless communication schemes, such as Zigbee, Bluetooth, Z-Wave, Thread, proprietary protocols or so forth. A security subsystem 590 may be provided (and which may include distributed RAM/ROM 595), which may be dedicated to perform security operations. Understand while shown with this high level view, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a memory;
   a memory repair controller coupled to the memory, the memory repair controller to provide repair information to cause the memory to disable one or more faulty locations in the memory, wherein the memory repair controller is to be disabled after providing the repair information;
   a boot oscillator to output a boot clock signal; and
   a control circuit to provide the boot clock signal to the memory repair controller after a reset and to gate the boot clock signal from being provided to the memory repair controller after the memory repair controller provides the repair information.

2. The apparatus of claim 1, further comprising a reset management circuit coupled to the memory repair controller.

3. The apparatus of claim 2, wherein the memory repair controller, after providing the repair information, is to send an acknowledgment signal to the reset management circuit to cause the reset management circuit to gate the boot clock signal.

4. The apparatus of claim 2, further comprising:
   a switchable power domain comprising the memory repair controller and the memory; and
   another power domain comprising the reset management circuit, the another power domain comprising an always powered on domain.

5. The apparatus of claim 4, wherein in a sleep state, the switchable power domain is to be powered down, the plurality of repair registers to retain the repair information while in the sleep state.

6. The apparatus of claim 3, wherein in response to the acknowledgment signal from the memory repair controller, the reset management circuit is to provide a system reset signal to a main processor.

7. The apparatus of claim 6, wherein the reset management circuit is to prevent another acknowledgment signal from the memory repair controller subsequent to the acknowledgment signal from causing another system reset signal to the main processor.

8. The apparatus of claim 1, further comprising a plurality of repair registers each associated with a portion of the memory, wherein the memory repair controller is to provide the repair information comprising faulty row/column information to the plurality of repair registers via a daisy chain.

9. A method comprising:
   in response to a boot clock signal received in a memory repair controller after a power-on reset event, accessing by the memory repair controller, encoded repair information in a non-volatile storage;
   decoding, in the memory repair controller, the encoded repair information and providing decoded repair information to one or more memory circuits; and
   thereafter sending a repair acknowledgment signal to a reset management circuit to cause the reset management circuit to de-assert a system reset signal to a main processor and to cause the memory repair controller to be powered down.

10. The method of claim 9, further comprising in response to the repair acknowledgment signal, gating the memory repair controller.

11. The method of claim 10, further comprising de-asserting the system reset signal after the reset management circuit receives the repair acknowledgement signal.

12. The method of claim 10, further comprising maintaining the memory repair controller powered down until a next power-on reset event, the memory repair controller in a switchable power domain with one or more memory circuits.

13. The method of claim 9, further comprising preventing a glitch from the memory repair controller from causing another system reset signal to be sent to the main processor.

14. The method of claim 9, further comprising enabling a boot oscillator in response to the power-on reset event, the boot oscillator to provide the boot clock signal to the memory repair controller.

15. The method of claim 9, further comprising sending the repair acknowledgment signal in response to verifying that the memory repair was completed successfully.

16. A device comprising:
   a reset management circuit to receive a system reset signal on a power-on reset of the device and delay provision of the system reset signal to a main processor;
   a boot oscillator to generate a boot clock signal in response to the power-on reset; and
   a memory repair controller coupled to the reset management circuit, the memory repair controller to operate using the boot clock signal, wherein the memory repair controller is to:
      provide repair information to a plurality of repair registers associated with memory circuitry, wherein in response to the repair information, the memory circuitry is to disable one or more faulty locations; and
      send a repair acknowledgement signal to the reset management circuit to cause the reset management circuit to gate the boot clock signal to prevent the boot clock signal from being provided to the memory repair controller, wherein the reset management circuit is to prevent the boot clock signal from being provided to the memory repair controller after the repair information is provided to the plurality of repair registers.

17. The device of claim 16, further comprising:
   a switchable power domain comprising the memory repair controller and the main processor; and
   another power domain comprising the reset management circuit, the another power domain comprising an always powered on domain.

* * * * *